United States Patent
Deaton

(10) Patent No.: US 8,671,373 B1
(45) Date of Patent: Mar. 11, 2014

(54) ANALYSIS OF CIRCUIT DESIGNS VIA TRACE SIGNATURES

(71) Applicant: Jasper Designs Automation, Inc., Mountain View, CA (US)

(72) Inventor: Craig Franklin Deaton, Rowlett, TX (US)

(73) Assignee: Jasper Design Automation, Inc., Mountain View, CA (US)

( * ) Notice: Subject to any disclaimer, the term of this patent is extended or adjusted under 35 U.S.C. 154(b) by 0 days.

(21) Appl. No.: 13/673,802

(22) Filed: Nov. 9, 2012

(51) Int. Cl.
*G06F 9/455* (2006.01)
*G06F 17/50* (2006.01)

(52) U.S. Cl.
USPC .......................................................... 716/106

(58) Field of Classification Search
USPC .......................................................... 716/106
See application file for complete search history.

(56) References Cited

U.S. PATENT DOCUMENTS

| | | | |
|---|---|---|---|
| 7,266,793 B1 * | 9/2007 | Agmon | 716/106 |
| 7,320,090 B2 * | 1/2008 | Coulter et al. | 714/30 |
| 7,512,839 B2 * | 3/2009 | Coulter et al. | 714/30 |
| 2004/0177332 A1 * | 9/2004 | Pandey et al. | 716/5 |
| 2007/0294650 A1 * | 12/2007 | Pandey et al. | 716/4 |
| 2009/0177969 A1 * | 7/2009 | Jones et al. | 715/730 |
| 2010/0257494 A1 * | 10/2010 | Pouarz et al. | 716/5 |
| 2013/0060545 A1 * | 3/2013 | Chockler et al. | 703/6 |

* cited by examiner

*Primary Examiner* — Suresh Memula
(74) *Attorney, Agent, or Firm* — Fenwick & West LLP

(57) ABSTRACT

A first signal trace is received including signal values satisfying a target event. A first trace signature is generated describing a portion of the first signal trace that causes the target event to occur. A second signal trace is generated that includes signal values satisfying the target event. A second trace signature is generated describing a portion of the second signal trace that causes the target event to occur. Differential signal events are determined that differentiate the first trace signature from the second trace signature. The differential signal events are events from the first signal trace that cause the target event to occur, but do not appear in the second trace signature. The process can be repeated to receive a plurality of signal traces, and to generate a plurality of signal traces. The differential signal events are indexed in a datastore in association with the signal traces.

22 Claims, 22 Drawing Sheets

ANALYSIS OF CIRCUIT DESIGNS VIA TRACE SIGNATURES

BACKGROUND

This invention relates generally to analysis of circuit designs, and more particularly to analyzing the behavior of sets of trace signatures.

As the complexity in circuit design has increased, there has been a corresponding need for improvements in various kinds of analysis and debugging techniques. In fact, these analysis and debugging techniques have evolved from relatively simple transistor circuit-level simulation (in the early 1970s) to logic gate-level simulation (in the late 1980s) to the current art that uses Register Transfer Language (RTL)-level simulation, and formal verification. RTL describes the registers of a computer or digital electronic system and the way in which data are transferred among the combinational logic between registers.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical tools to create a HDL-based design.

An increasingly popular technique is to use formal methods to verify the properties of a design completely. Formal methods use mathematical techniques to prove that a design property is either always true or to provide an example condition (called a counterexample) that demonstrates the property is false. Many tools that use formal methods to verify RTL source code and design properties are known as "model checkers." Design properties to be verified include specifications and/or requirements that must be satisfied by the circuit design. The formal verification technology requires that the requirements are expressed in a formal notation, for example a temporal language (such as PSL and SVA), which enables an exhaustive mathematical check whether a design complies with the requirements.

An existing method of analysis explores the RTL level in view of a multi-bit signal. The method explores different ways to exercise a circuit design resulting in varying the value of the multi-bit signal. Similarly, different ways of exercising a circuit design resulting in a consistent value for the multi-bit signal may be explored. In one instance, an initial trace is received and an expression is obtained describing the value of a target multi-bit signal. The expression is negated and used as a constraint in generating an additional trace which serves as an extension to the initial trace. This process is repeated to generate additional trace extensions, but it is unclear to the user what commonalities and differences are present in the various segments of the resulting trace. Each additional trace is generated by appending additional signal values to the end of its parent trace.

SUMMARY

Embodiments of the invention provide mechanisms for extracting signatures from waveforms generated with respect to the circuit design, and for operating on those signatures in useful ways to enhance the productivity of circuit designers. In one embodiment, a signature is extracted from a single trace. That signature is converted into an expression and the negation of that expression is applied as a constraint. A new trace is generated subject to the constraint. A new signature is extracted from the new trace and the two signatures are analyzed to determine what set of literals they have in common. The set of common literals is converted to an expression, and the negation of that expression is again applied as a constraint used in generating a new trace. The process is repeated to generate additional traces.

In another embodiment, signatures are extracted across a set of pre-existing traces and placed in a data store. The intersection of those signatures is calculated and placed in a data store. One trace is then omitted from the set, and the intersection of the remaining traces is calculated, along with the L-diff of the first intersection with the second. By repeating this process, the traces are arranged into a hierarchy organized by their common set of literals.

In yet another embodiment, the trace generation flow described above is modified to proceed via parallel analysis. In addition to a first trace generation occurring that assumes the negation of the intersection, another occurs that assumes the intersection and the negation of the literal(s) that differentiates that intersection from the previous intersection.

Data, such as signatures, behaviors, and traces, is then stored and an index is provided including various ways in which the circuit design may behave. The set of indexed behaviors correspond to operations that the circuit design is capable of performing and the set of trace signatures correspond to various ways in which those behaviors can be combined.

The indexed behaviors, traces, and signatures enable a number of useful circuit analysis tools, which query the indexed information and present the information about the circuit design in a number of useful ways. In one embodiment, for example, the signatures are displayed as a tree organized by the behaviors that the signatures have in common. In another embodiment, each signature, in whole or in part, can be converted into a functional cover point for simulation or formal analysis. In yet another embodiment, the set of behaviors indexed from one design or trace event is compared against the set indexed from a different design or trace event. Additionally, behaviors or signatures can be used to restrict the scope of existing properties. The indexed traces may be searched to identify traces that exhibit or fail to exhibit some user-specified behavior.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

System Overview

Figure 1:
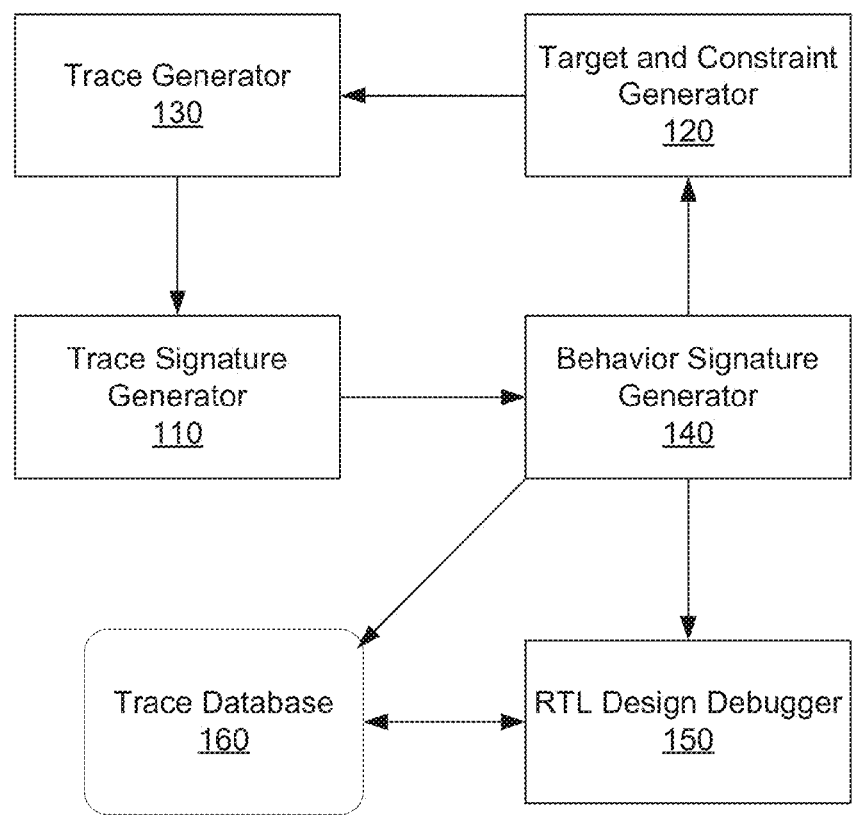
FIG. 1 illustrates a system for analyzing circuit designs via trace signatures according to one embodiment.

FIG. 1 illustrates a system 100 for analyzing circuit designs via trace signatures according to one embodiment. The trace signature generator 110 receives one or more target events and, in one embodiment, one or more traces. Based on the received events and traces, the trace signature generator 110 generates trace signatures or a seed trace signature. A signature is a descriptor that captures qualities of the chain of causality leading to the occurrence of an event in a given trace or family of traces. In one embodiment, a signature is captured by a temporal conjunctive normal form with respect to a target event. The clock cycles in the signature are called "signature cycles" and are counted back from the occurrence of the target. Cycle 0 is the clock cycle during which the target event occurs; cycle 1 is one clock cycle before the target event occurs and so on. An exemplary algorithm used to extract a signature of a target in a trace utilizes a "transitive why" analysis (i.e. a causality analysis to identify signal behaviors that cause a target event to occur). A description of this analysis is included in U.S. Pat. No. 7,137,078, which is incorporated by reference in its entirety.

Figure 8:
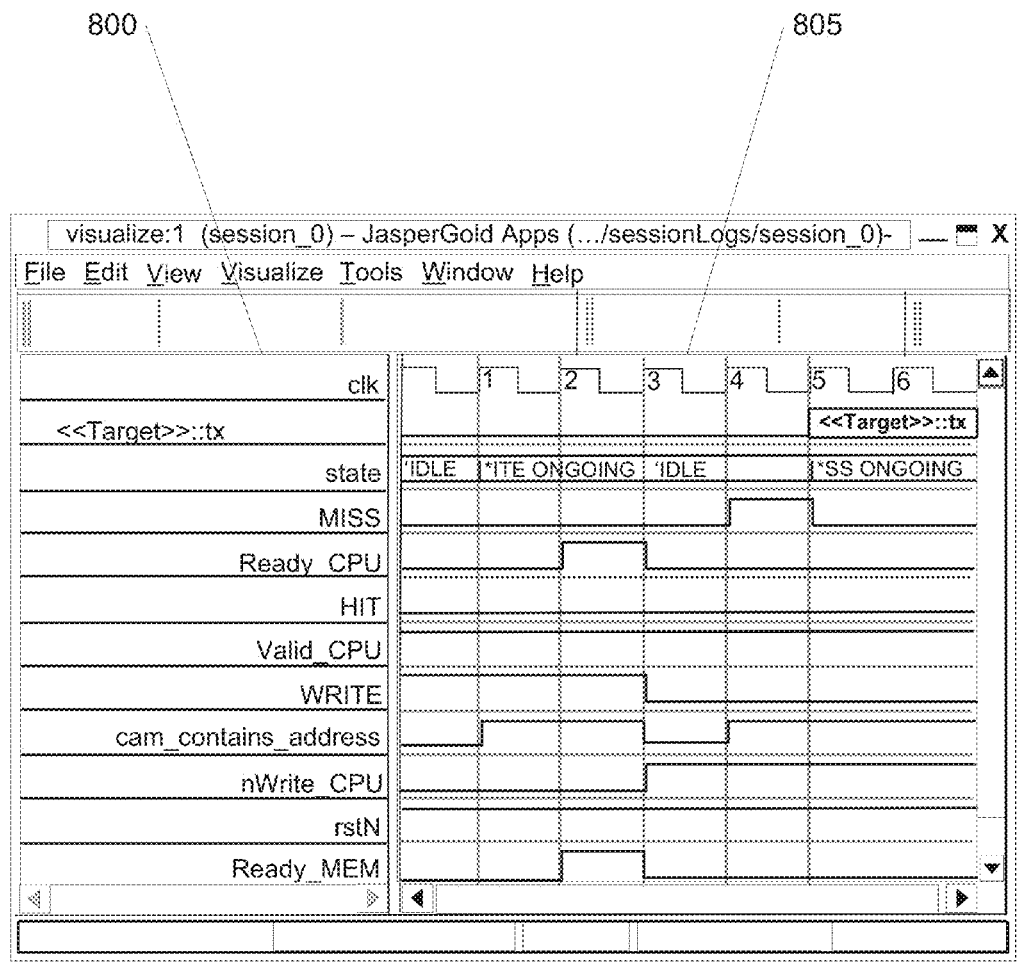
FIG. 8 illustrates an example trace waveform according to one embodiment.

A signature can be represented in different manners and is not restricted to any particular form. For example, an ordered list of (cycle, literal-list) may be used as a format for representing a signature. A literal is a signal value pair. For simplicity, a signal that only have values 0 or 1 is usually shown as "!signal" for (signal, 0) and "signal" for (signal, 1). An example of a trace represented by signal waveforms is illustrated in FIG. 8 according to one embodiment. Window 800 lists a plurality of signals present in a circuit design being analyzed, e.g., Ready_CPU, HIT, WRITE. A reference clock is shown along the top of window 805, with the clock cycles numbered. In line with the signals listed in window 800, window 805 depicts a waveform of the value of each of the signals as the clock progress from cycle to cycle.

An example of a portion of a signature is:
{1{(state=='MISS_ONGOING) !Ready_CPU}
 2 {!Ready_MEM}
 3 {!MISS !Ready_CPU !HIT Valid_CPU !WRITE !cam_contains_address nWrite_cpu rstN}}

In this example, the target event is the signal "state" at cycle 6 of the clock. The cycle numbers in the signature refer to the number of cycles by which the cycle precedes the target event cycle. Since, the target event occurs in cycle 6 of the clock, 2 {!Ready_MEM} indicates that the signal Ready_MEM is low in cycle 4. In the example signature above, state==miss_ongoing and Ready_CPU==0 are true 1 cycle prior to the target event. Similarly, Ready_MEM==0 is true 2 cycles prior to the target event.

A target event may be any expression that can be evaluated true or false. A target event can be specified by a pair <cycle-on-trace, signal>. When applied to a trace, the value of such a signal on the specified cycle is known, so a signal value pair can be extracted <signal, value>. This signal value pair can be setup as a triple <0, signal, value> as the initial input to the why analysis.

Using a triple, the why analysis selects a subset of the signals as relevant signals. If only combinational logic is traversed, these signals are marked as the same cycle as the target cycle. If a state holding element has been traversed, these signals are marked as one cycle in the past from the target cycle. Each item from the analysis of the triple may be recorded in a data store. By performing the why analysis on results of other why analysis, more triples can be extracted. Various heuristics can be used to extract a subset of the resulting triples to form a signature including filtering out signals that are wider than 1 bit, filtering out signals whose fanin has been covered by other triples in the original set, and utilizing signals from specific modules/instances in the register-transfer level description.

Additionally, a constraint can be created from a signature. A constraint is a condition that must be true when performing an action such as generating a differentiated trace as later described. The values of signals, captured in a signature from previously generated traces may be used as constraints in generating new traces. In some cases, a negated version of some aspect of a trace may be used as a constraint when generating a new trace. A negated version of a trace indicates that a newly generated trace must have some signal value different from the non-negated trace. A constraint can be used in "visualizing" a trace generation, as described in U.S. Pat. No. 7,421,668, which is hereby incorporated by reference in its entirety. A constraint may, for example, take the form of a property specification language (PSL) or system verilog assertion (SVA) temporal expression.

The behavior signature generator 140 receives the trace signatures from the trace signature generator 110 and generates behavior signatures. The same format for representing signatures can be used to capture signatures of varying complexity. Signatures fall within classes including trace signatures, partial trace signatures, behavior signatures, and intersection signatures. Signatures can be calculated using one or more operations including an intersection operation, L-diff operation and union operation. Traces, trace signatures and behavior signatures may be stored in the trace database 160 for presentation to users and subsequent access.

The intersection operation generates a signature containing, for each cycle, literals present in each. of two parameter signatures.

The L-diff operation generates a signature containing, for each cycle, literals present in a first parameter signature, but not a second parameter signature. It is a differential comparison of two trace signatures that produces a signature containing the signal values that occur in the first, or left, parameter, but not the second. The comparison is performed for each cycle of the signatures.

The union operation generates a signature containing, for each cycle, literals present in either a first or a second parameter signature.

Additionally, a signature can be translated into a temporal expression, e.g, PSL or SVA. In one embodiment, the Get_expr(x) operation translates a signature into a valid temporal expression representation of the signature that is written in a property specification language such as SVA or PSL.

Given example signatures of:
x) 1 {a b c} 2 {!d e f} 3{g !h i}
y) 1 {a b e} 2 {!d f g} 4{g !h i}

The labels x and y refer to signatures, the numbers 1, 2 and 3, refer to clock cycle numbers relative to a target event cycle, and the labels a to i represent signals in a circuit design. Example operations include:

Intersection(x, y): 1{a b} 2{!d f}
L-diff(x, y): 1{c} 2{e} 3{g! h i}
L-diff(y, x): 1{e} 2{g} 4{g !h i}
Union(x, y): 1{a b c e} 2{!d e f g} 3{g !h i} 4{g !h i}
Get_expr(x): $past((a && b && c,) 1) && $past ((!d &&e &&f),2) && $past((g && !h && i),3)

It should be noted that there may be other valid expressions which are produced by the Get_expr operator.

In one embodiment, a behavior signature is generated by taking the L-diff of the signature of a parent trace with the intersection of the parent trace signature and the signature of a child trace. The child trace is a differentiated trace generated using a negated expression based on the signature of the parent trace as a constraint.

The target and constraint generator 120 receives signatures such as behavior and/or intersection signatures, converts them into an expression and/or constraints as demonstrated in the discussion of FIG. 3. The trace generator 130 receives a target event and constraints from the target and constraint generator 120, and generates or receives one or more traces that satisfy the conditions specified by the target event and constraints.

In one embodiment, the RTL design debugger 150 includes a traditional waveform display and debugger. Traces, trace signatures, and behavior signatures may be retrieved from, or stored in, trace database 160. Traces and signatures stored in the trace database 160 can be modified further and presented to the user to aid in analysis. Additional highlights of traces may be displayed to a user based on the temporal expression of behavior signatures. An example of such a system is disclosed in U.S. Pat. No. 8,103,999, which is incorporated by reference in its entirety. The design debugger may also be configured to present traces in a structural fashion as later described.

Trace Analysis

Figure 2A:
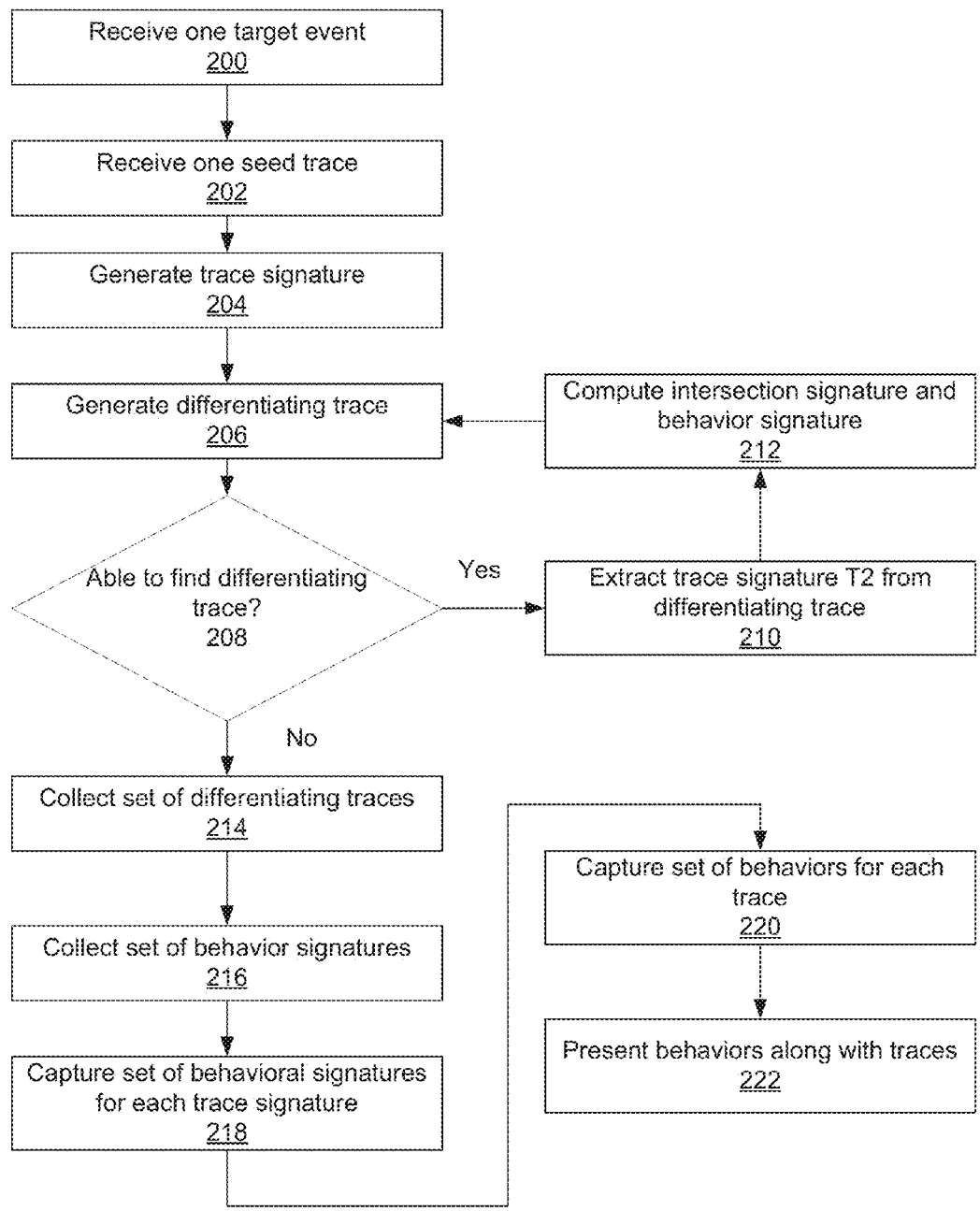
FIG. 2A illustrates a method for analyzing circuit designs via trace signatures according to one embodiment.

FIG. 2a illustrates a method for analyzing circuit designs via trace signatures according to one embodiment. The trace signature analysis system 100 receives 200 a target event. In one embodiment, more than one target event is received. A seed trace is received 202. In one embodiment, more than one initial seed trace may be received. The initial seed trace may be provided through RTL simulation, received from an external source or generated through a waveform algorithm with the received target event as the target that must be satisfied. A method for generating such a trace based on a target event is described in U.S. Pat. No. 7,421,668. A trace is one or more waveforms indicating the values of signals in a circuit design over a plurality of cycles.

The trace signature generator 110 generates 204 a trace signature from the seed trace based on the target event. The system then attempts to generate 206 a differentiating trace from the generated trace signature. To accomplish this, the trace signature is converted into an expression and the expression is negated. The negated expression serves as a constraint for subsequent trace generation. The system attempts to generate a trace that exercises the target event while satisfying the newly generated constraint. If a differentiating trace can be generated, block 208 passes the newly generated trace to block 210 which extracts a trace signature from the newly generated trace. The trace signature is then processed to determine 212 intersection signatures and behavior signatures when compared to previously generated trace signatures. The intersection signature is determined by intersecting the newly generated trace signature with a previous trace signature or intersection signature. A behavior signature is calculated by performing the L-diff operation of the new intersection signature to the previously processed intersection signature. An operational loop continues to generate additional traces 206 using additional constraints as described in the example of FIG. 3. In future iterations, the constraint applied in generating additional differentiated traces is the negated expression of the intersection of previously generated trace signatures.

If no differentiating trace can be generated which satisfies the constraints, the set of differentiating traces are collected 214 and stored. The determined behavior signatures are similarly collected 216 and stored. Additionally, the system identifies and captures 218 which behavior signatures are included in which trace signatures. The relationship can be captured when behavior signatures are first determined in step 212 or later recovered by performing an intersection operation of each behavior signature with the trace signatures. The relationships identified in step 218 are utilized to identify relationships between behaviors and traces based on the behavioral signatures and trace signatures. In one embodiment, step 218 may be skipped and each behavior signature may be intersected with each trace to see if a trace exercises a specific behavior signature.

The behavior signatures are subsequently presented 222 to a user. The behavior signatures, traces, and trace signatures may also be stored in a database that indexes the information and relates the behaviors and traces with each other. All information generated during the process described in FIG. 2 may be stored in the database. After storing the data, in a functional verification environment for RTL design development, traces are typically presented to the user for comprehension and debugging purposes. The behavior signatures related to a specific trace currently shown to a user can presented alongside the trace to aid in comprehension and debugging of the trace. Examples of highlights on traces can be found in U.S. Pat. No. 8,103,999. Additionally, traces may be presented in a structural fashion together with relevant behavior signatures for each trace.

Figure 2B:
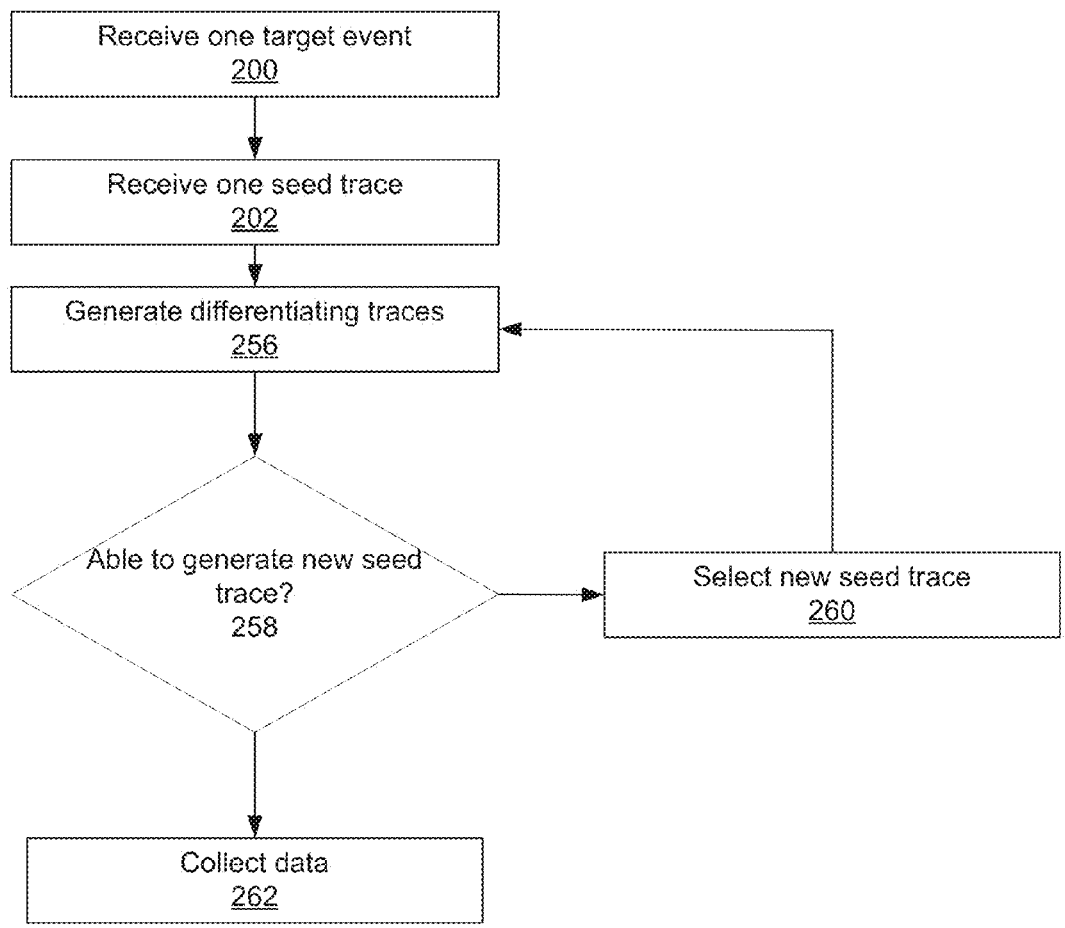
FIG. 2B illustrates an extension of the method described in FIG. 2A, using differentiating traces as seed traces to extract additional differentiating traces and behavior signatures according to one embodiment.

FIG. 2b illustrates an extension of the method described in FIG. 2, using differentiating traces as seed traces to extract additional differentiating traces and behavior signatures. Blocks 200 and 202 perform the same function as described in FIG. 2a. Additionally, block 256 represents blocks 204-212 in FIG. 2a and the repeating loop of operations performed by those blocks generating differentiating traces and behavior signatures based one seed trace.

In the method described by FIG. 2b, the differentiating traces generated by block 256 are candidates to be used as seed traces and used in a new iteration of the process performed by block 256. In this embodiment, differentiating traces generated by block 256 are candidates as seed traces to run block 256 again. Block 258 determines whether differentiating traces should be used as a new seed trace based on heuristics analyzing existing differentiating traces. In one embodiment, the decision is made based on the extent to which the differentiating traces are captured by the existing set of behavior signatures. For example, the L-diff operation may be performed to remove existing behavior signatures from the traces signature and analyze how much of a partial trace signature remains. A differentiating trace passing such a heuristic test is selected 260 and passed to block 256 for use as a seed trace. When it is determined 258 that all interesting differentiating traces have been processed by block 256 as seed traces, data is collected 262 as previously described in blocks 214-222 of FIG. 2a.

Figure 3A:
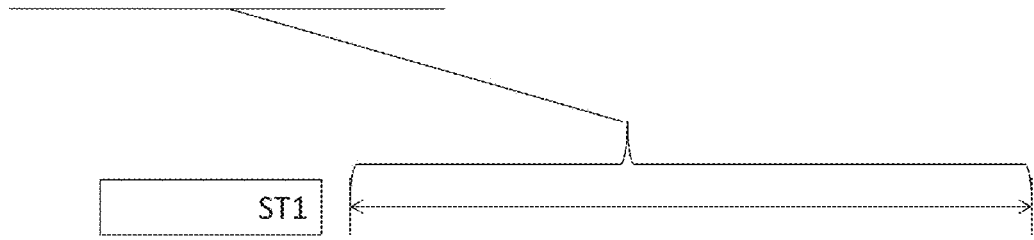
FIGS. 3A-P illustrate a series of traces and the analysis performed to identify behavior signatures according to one embodiment.
Figure 3B:
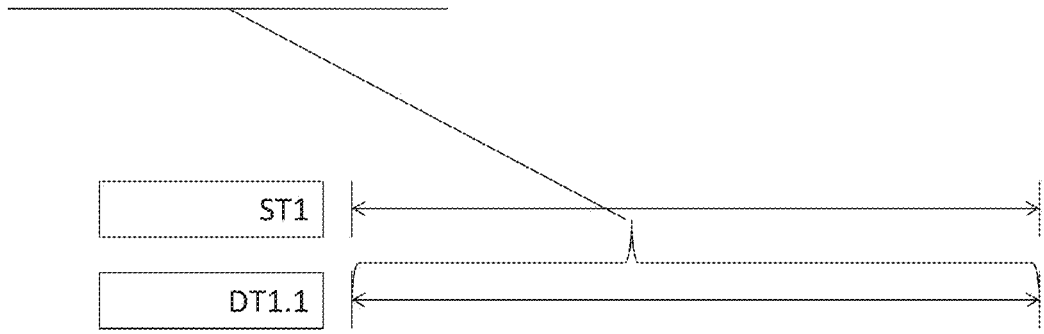
Figure 3C:
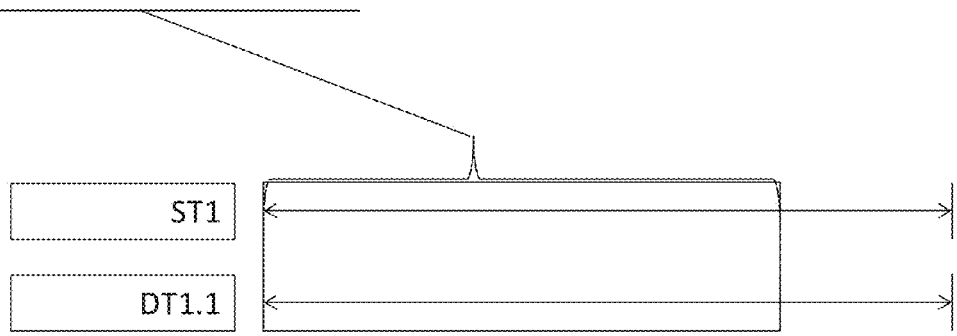
Figure 3D:
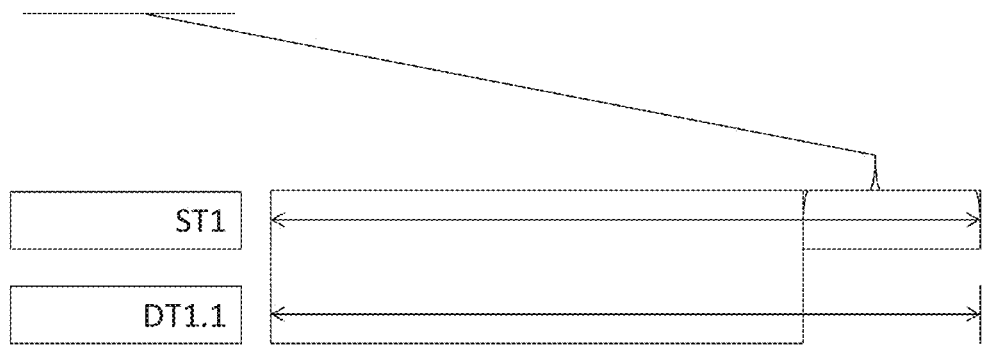
Figure 3E:
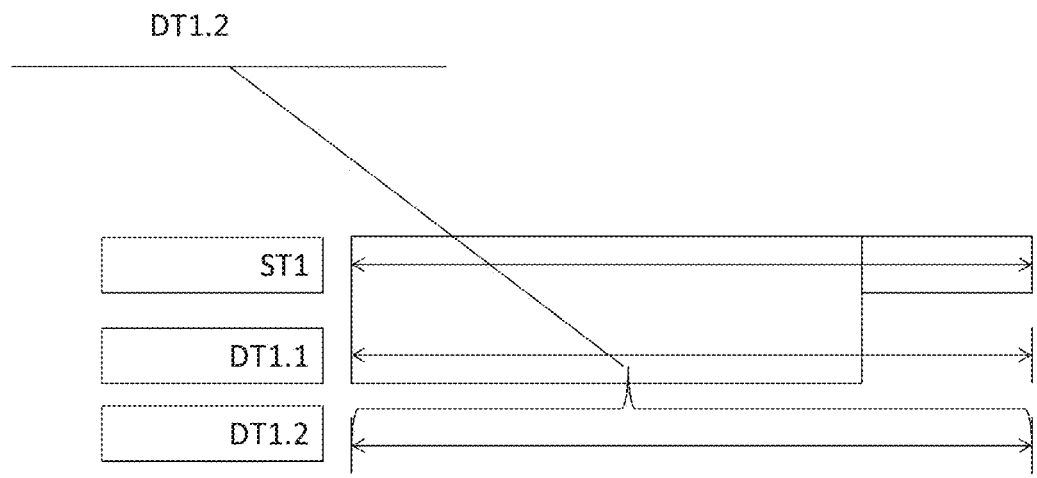
Figure 3F:
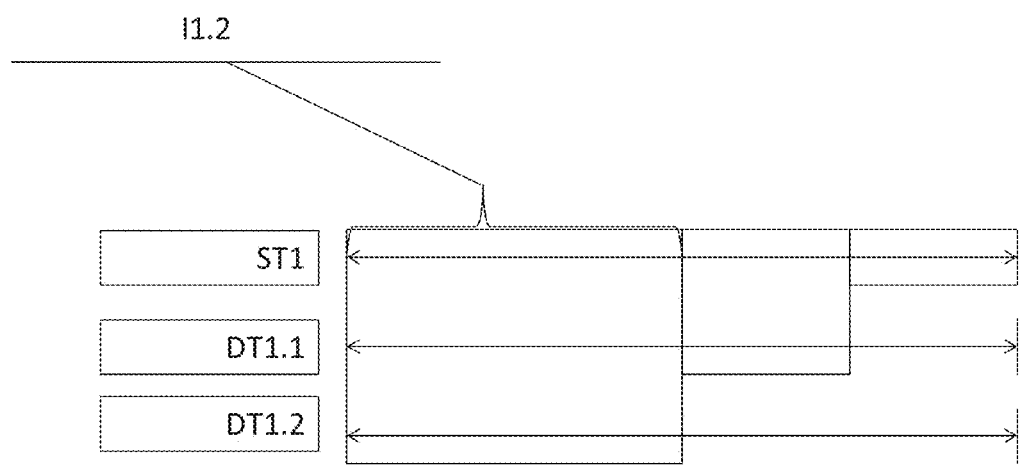
Figure 3G:
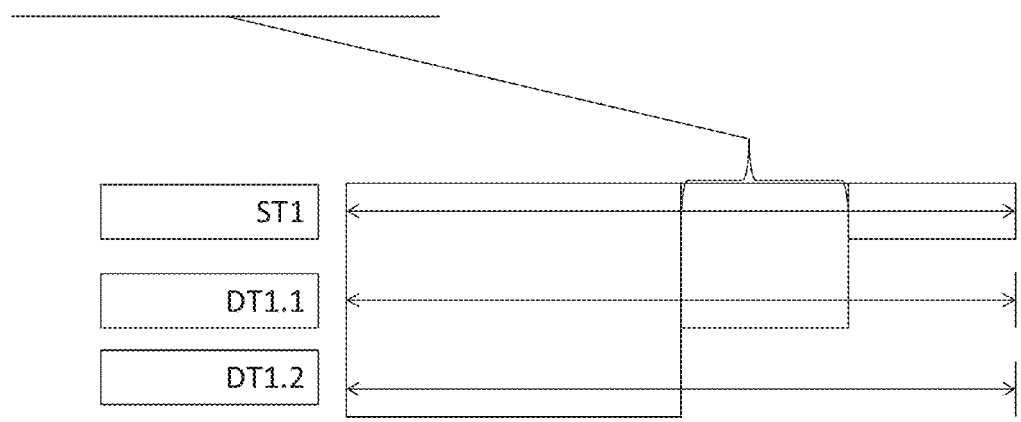
Figure 3H:
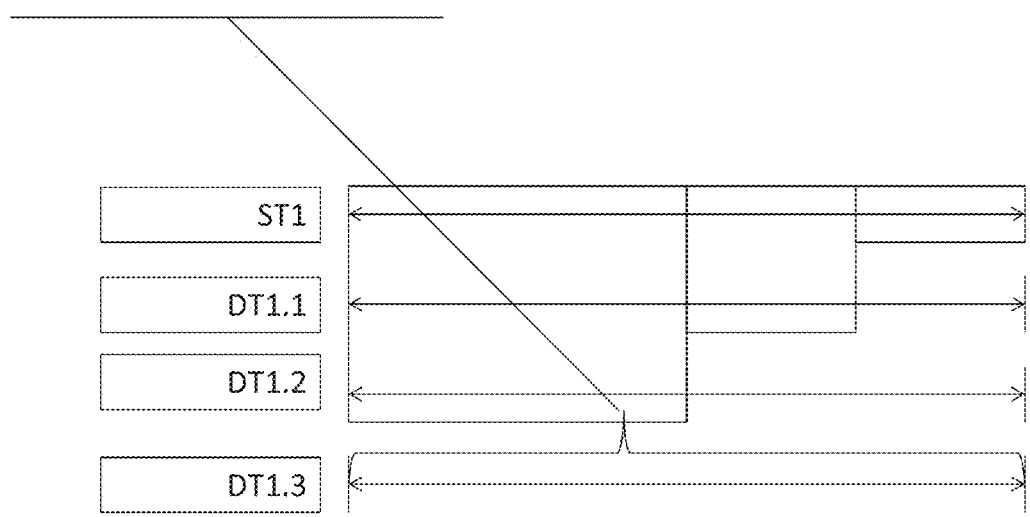
Figure 3I:
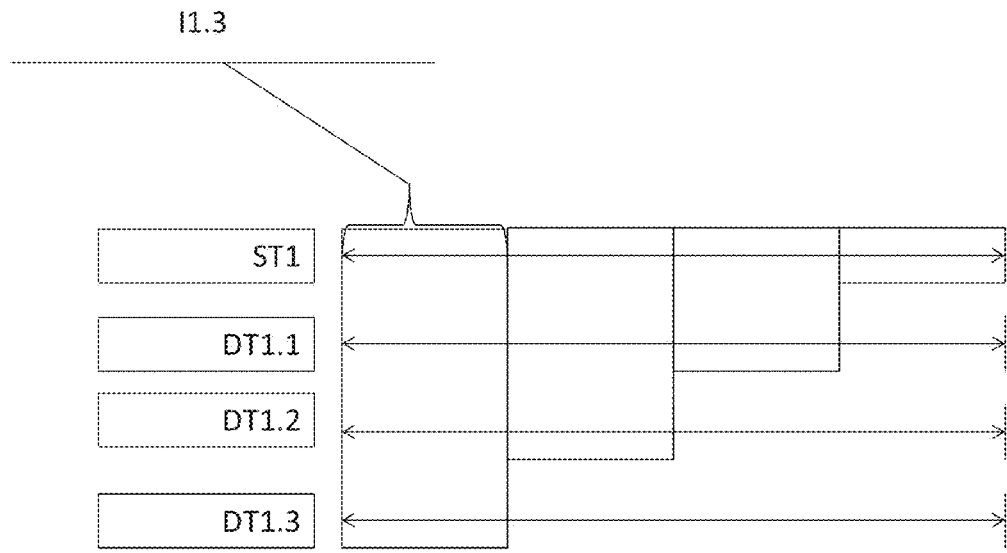
Figure 3J:
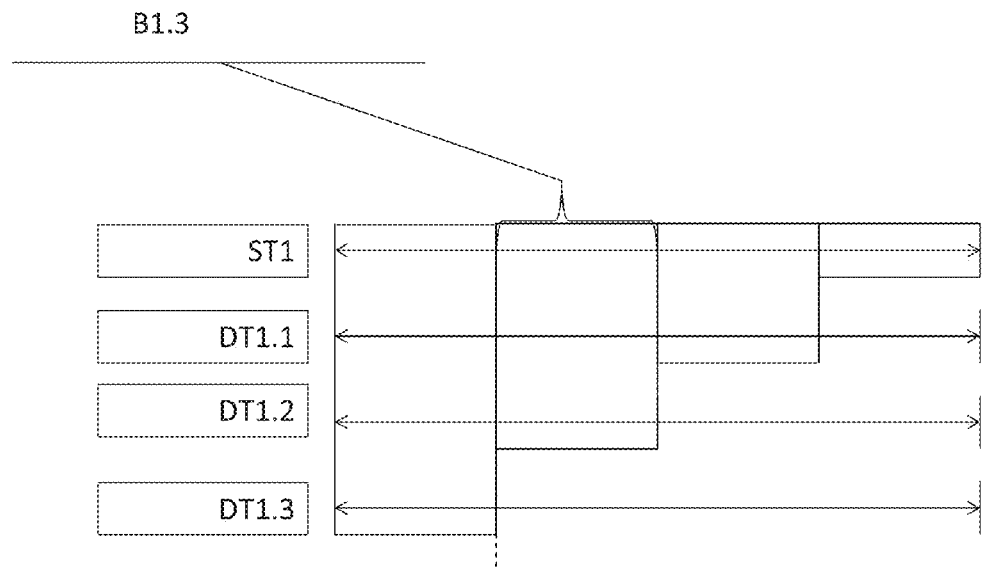
Figure 3K:
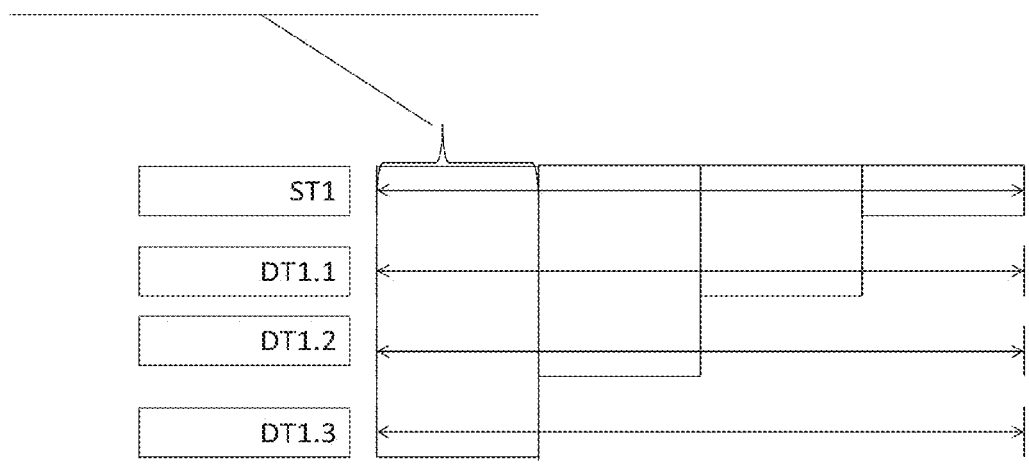
Figure 3L:
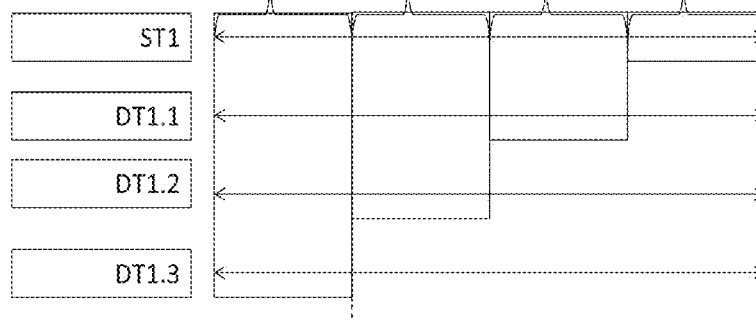
Figure 3M:
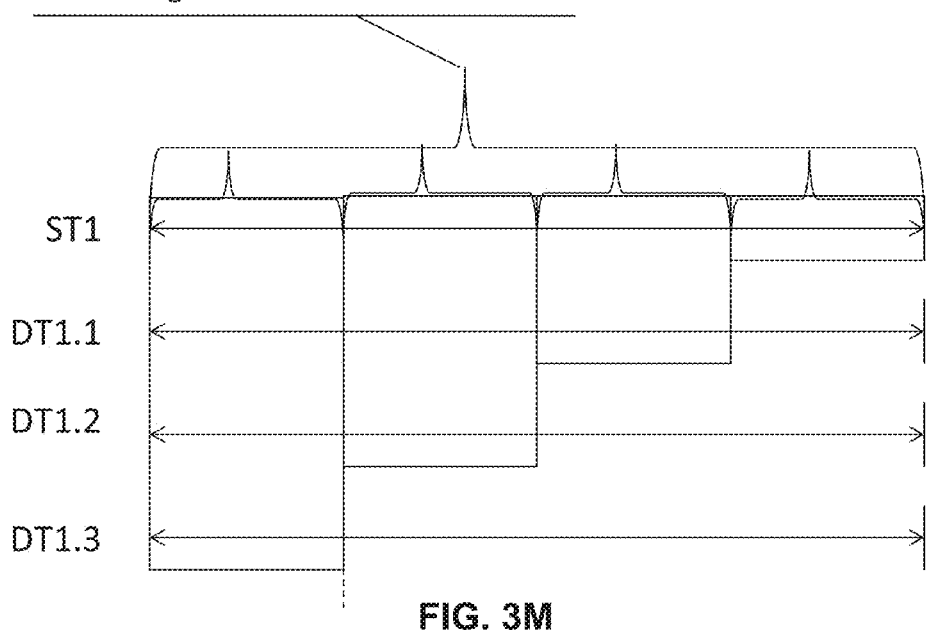
Figure 3N:
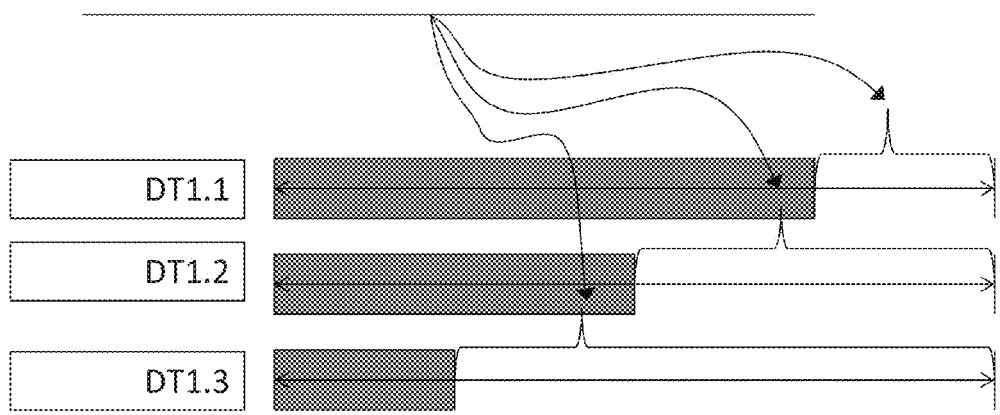
Figure 3O:
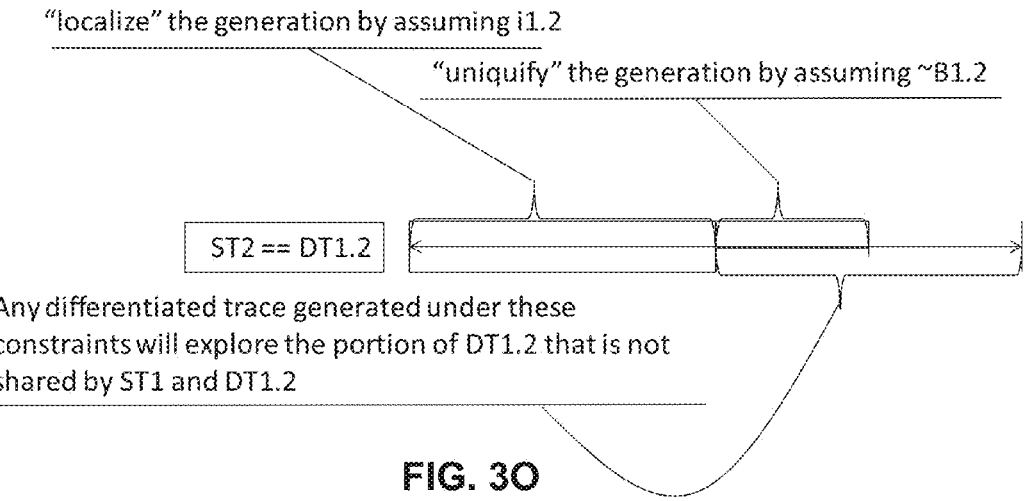
Figure 3P:
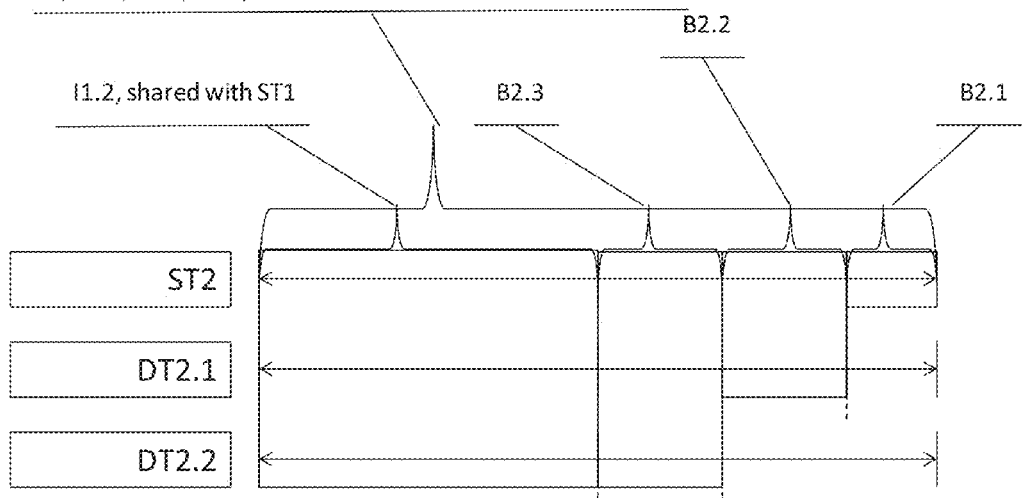

FIGS. 3A-P illustrate a series of traces and the analysis performed to identify behavior signatures according to one embodiment. FIG. 3A illustrates an initial trace signature which satisfies a target event and meets any additional constraints that may be imposed by a user. The initial trace signature is used as seed trace 1 (ST1). FIG. 3B illustrates a second trace signature DT1.1 for the first differentiated trace based on ST1. To generate DT1.1, ST1 is converted to an expression using the Get_expr operation and negated. The negated expression is used as a constraint for the trace generator. A trace is generated by the trace generator that satisfies the same target event input used in generating ST1, but uses the negated expression of ST1 as a constraint. A signature may be negated by converting that signature to an expression using the Get_expr function and then negating the expression. For example, signature x: (1{a b c} 2{!d e f} 3{g !h i}) would be converted to ($past((a && b &&c)),1) && $past((!d && e && f),2) && $past((g && !h && i),3)), which would be negated to ~($past((a && b &&c)),1) && $past((!d && e && f),2) && $past((g && !h && i),3)) or, equivalently, ($past ((!a||!b||!c)),1)||$past((d||!e||!f),2)||$past((!g||h||!i),3)). This negated expression would then be utilized as a constraint by a trace generator. The resulting trace is represented by the signature labeled DT1.1. DT1.1 satisfies the target event but is different from and does not contain at least some of the events included in ST1.

The intersection operation is performed on ST1 and DT1.1, and the resulting signature is referred to as intersection signature I1.1 as illustrated in FIG. 3C. Intersection signature I1.1 consists of all of the events that are in both ST1 and DT1.1. The L-diff of ST1 with I1.1, i.e., the portion of ST1 that does not appear in the intersection of ST1 and DT1.1 is defined as behavior signature B1.1 as illustrated in FIG. 3D. A behavior signature contains one or more first differential signal events that differentiates a first trace signature from a second trace signature. In FIG. 3E, trace signature DT1.2 is generated. To generate DT1.2, the trace generator again generates a trace satisfying the target event. This time, the negated expression of I1.1 is input as a constraint to the trace generator. This ensures that the newly generated trace signature DT1.2 will be to some degree different from both ST1 and DT1.1. In FIG. 3F, the intersection of ST1, DT1.1, and DT1.2 is found and referred to as intersection I1.2. In FIG. 3G, the L-diff operation is used to find the L-diff of I1.1 with I1.2. The resulting signature is designated behavior B1.2. The absence of B1.2 is what differentiates DT1.2 from DT1.1.

A third differentiated trace signature (DT1.3) is generated in FIG. 3H. The constraint for this trace generation is the negated expression of I1.2. The trace generator produces trace signature DT1.3 by generating a trace which satisfies both the same initial target event and the newly identified constraint based on the negation of I1.2. The intersection of ST1, DT1.1, DT1.2, and DT1.3 is found and designated intersection I1.3 as illustrated in FIG. 3I. In FIG. 3J, the L-diff operation is used to find the L-diff of I1.3 with I1.2 and produces behavior B1.3. The absence of B1.3 is what differentiates DT1.3 from DT1.2 (and all prior traces).

While in many cases a large number of differentiated traces can be generated, for instructional purposes it is assumed no differentiated traces can be generated beyond DT1.3. As illustrated in FIG. 3K, Behavior B1.4 is equal to I1.3 since no additional traces are generated. B1.4 can also be calculated utilizing the L-diff operation as previously described. In this case, the right-hand parameter of the L-diff operation would be the null signature, containing no events, since no new trace was found. FIG. 3L illustrates that each of the trace signatures (ST1 and DT1.1-1.3) include one or more of behaviors B1.1-B1.4. FIG. 3M illustrates that the seed trace signature ST1 is equal to the union of all behavior signatures B1.1-1.4.

As illustrated in FIG. 3N, the process can be continued by using an unexplored portion of an existing trace signature as a seed trace signature. For example, the L-diff of ST1 with DT1.1 produces a trace signature that may yield additional behavior signatures when used as seed traces in new iterations of the process described in FIG. 3. As illustrated in FIG. 3O, in one embodiment, a new seed trace may be generated by constraining the new seed trace to include I1.2 (from FIG. 3C), with an additional constraint of the negated expression of behavior signature B1.2 (from FIG. 3L). Constraining the new seed trace to include I1.2 is referred to as the localizing constraint giving a starting point. The negated expression of B1.2 ensures that the new seed trace will contain some differences with respect to the original seed trace ST1 Such a new seed trace may be designated ST2. FIG. 3P demonstrates how additional iterations of the process using ST2 can result in additional differentiated trace signatures, and how ST2 and the additional differentiated trace signatures may, in some cases, be decomposed into multiple combinations of behavior signatures.

Figure 4A:
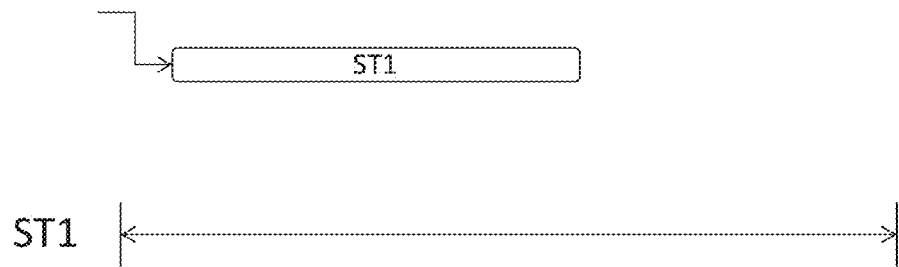
FIGS. 4A-G illustrate a series of traces and a method for performing signature analysis in parallel according to one embodiment
Figure 4B:
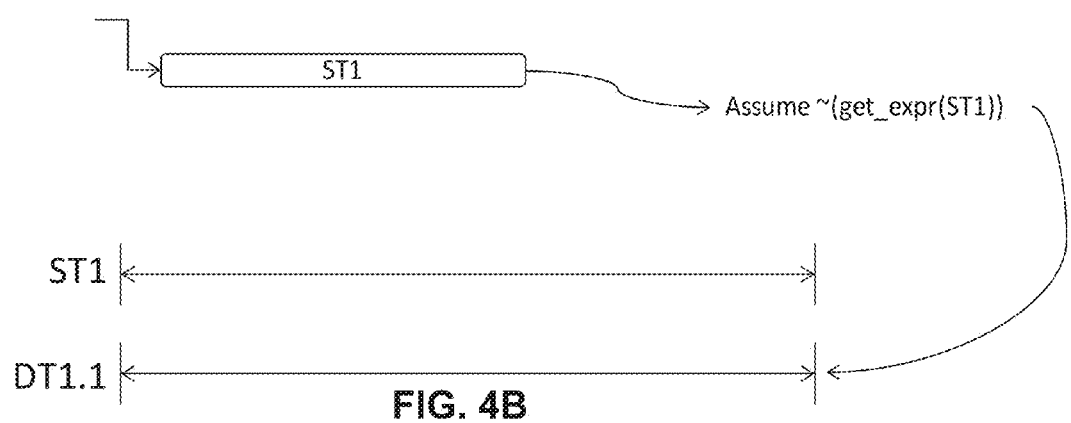
Figure 4C:
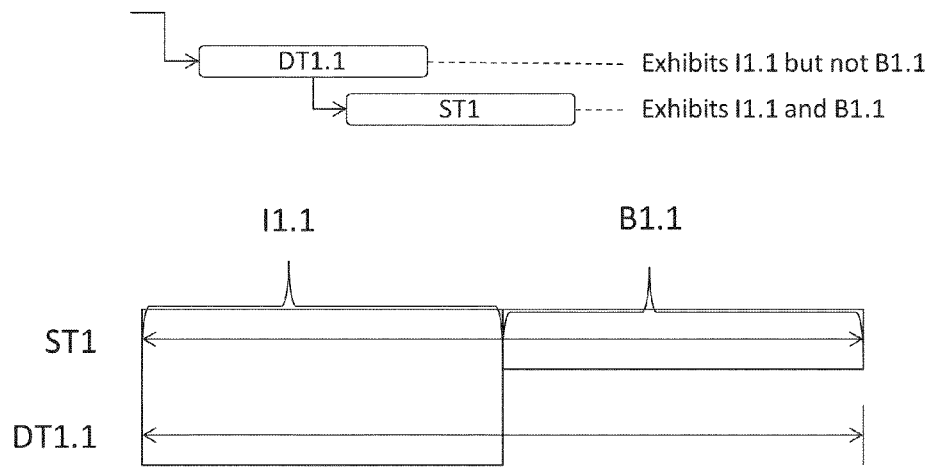

FIGS. 4A-F illustrate a series of traces and a method for performing signature analysis in parallel according to one embodiment. FIG. 4A illustrates an initial seed trace similar to that of FIG. 3 which satisfies a target event. FIG. 4B illustrates generating DT1.1 based on ST1. The negated expression of ST1 is applied as a constraint when generating DT1.1, which also satisfies the target event. This first differentiation is an atomic operation that is not performed in parallel with other differentiations. FIG. 4C illustrates that ST1 is made up of I1.1 and B1.1. I1.1 may be calculated by taking the intersection of ST1 and DT1.1. B1.1 may be calculated by taking the L-diff of ST1 and I1.1.

Figure 4D:
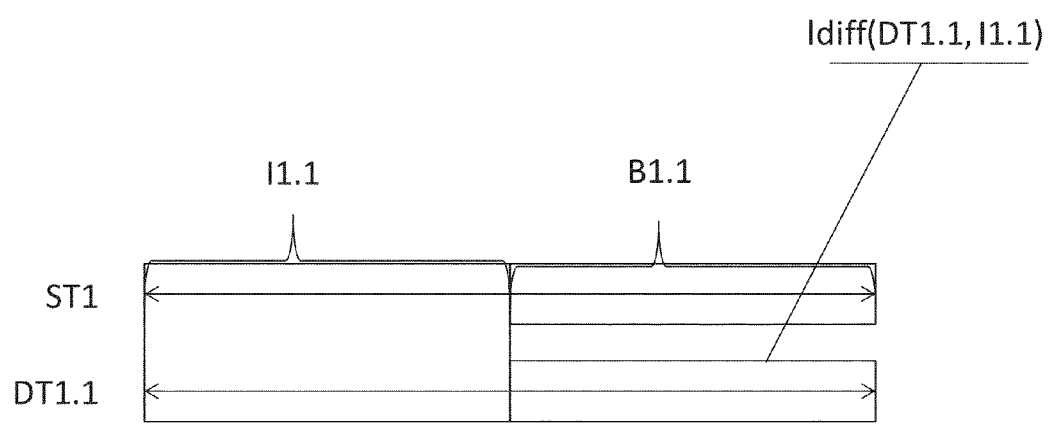
Figure 4E:
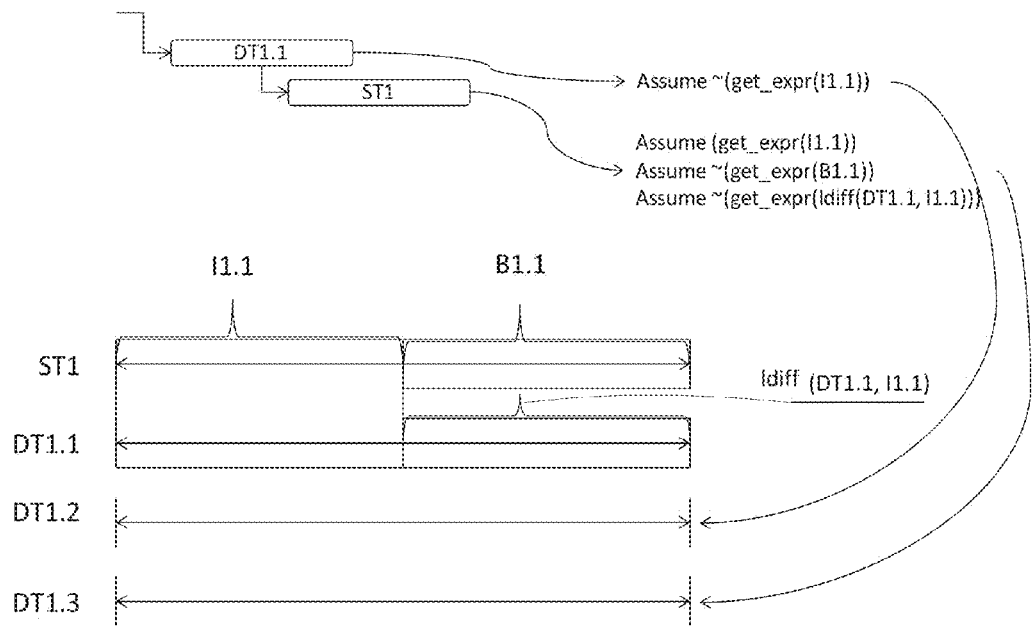
Figure 4F:
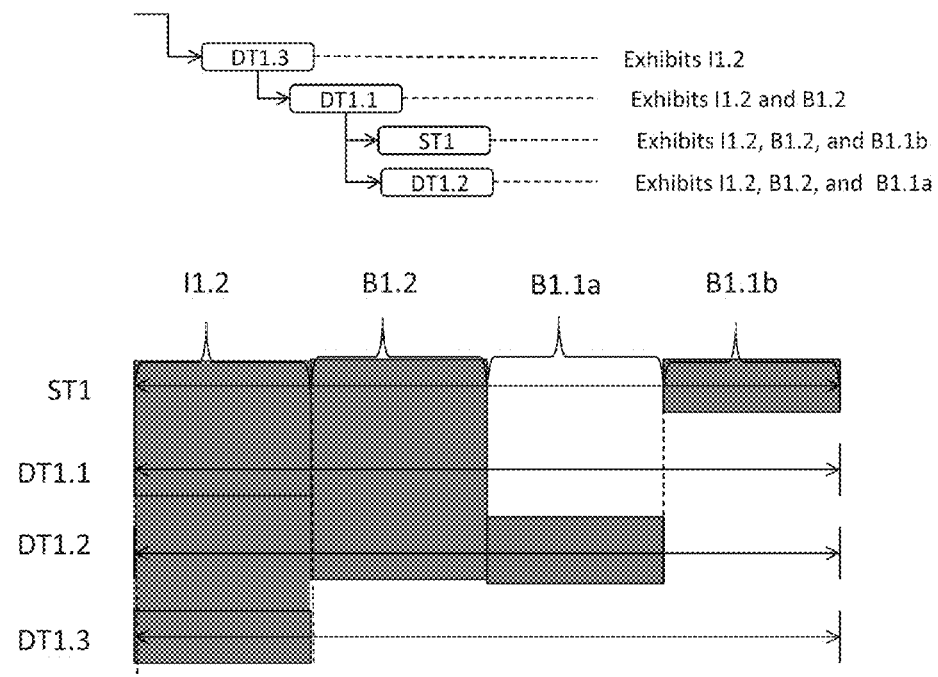
Figure 4G:
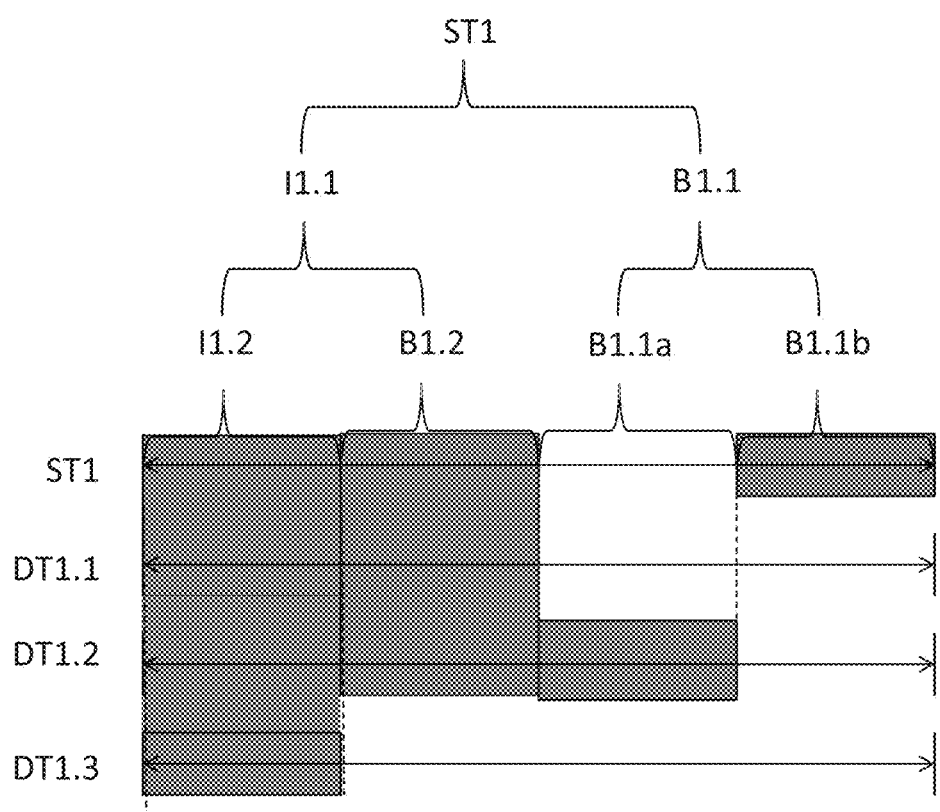

FIG. 4E illustrates parallel differentiations performed based on ST1 and DT1.1. DT1.2 is generated by applying the negated expression of I1.1 as a constraint. DT 1.3 is generated by applying the expression of I1.1 and the negated expression of B1.1 along with the negated expression of the LDIFF of DT1.1 and I1.1 (as illustrated in FIG. 4D) as constraints. In this manner, multiple additional differentiated signatures can be calculated at one time improving performance of the system. The parallel signatures may be produced, for example, using different computing threads at the same time. FIG. 4F illustrates how the behavior signatures and intersection signatures may be generated in one case of parallel differentiation. Splitting may occur, e.g., B1.1b occurs only in ST1 while B1.1a occurs only in DT1.2. Additionally, intersection signature I1.2 occurs in ST1, DT1.1, and DT1.3, but not DT1.2. FIG. 4G illustrates a distributed hierarchical decomposition describing how various components of the trace signatures can be broken down into multiple signatures.

Figure 5:
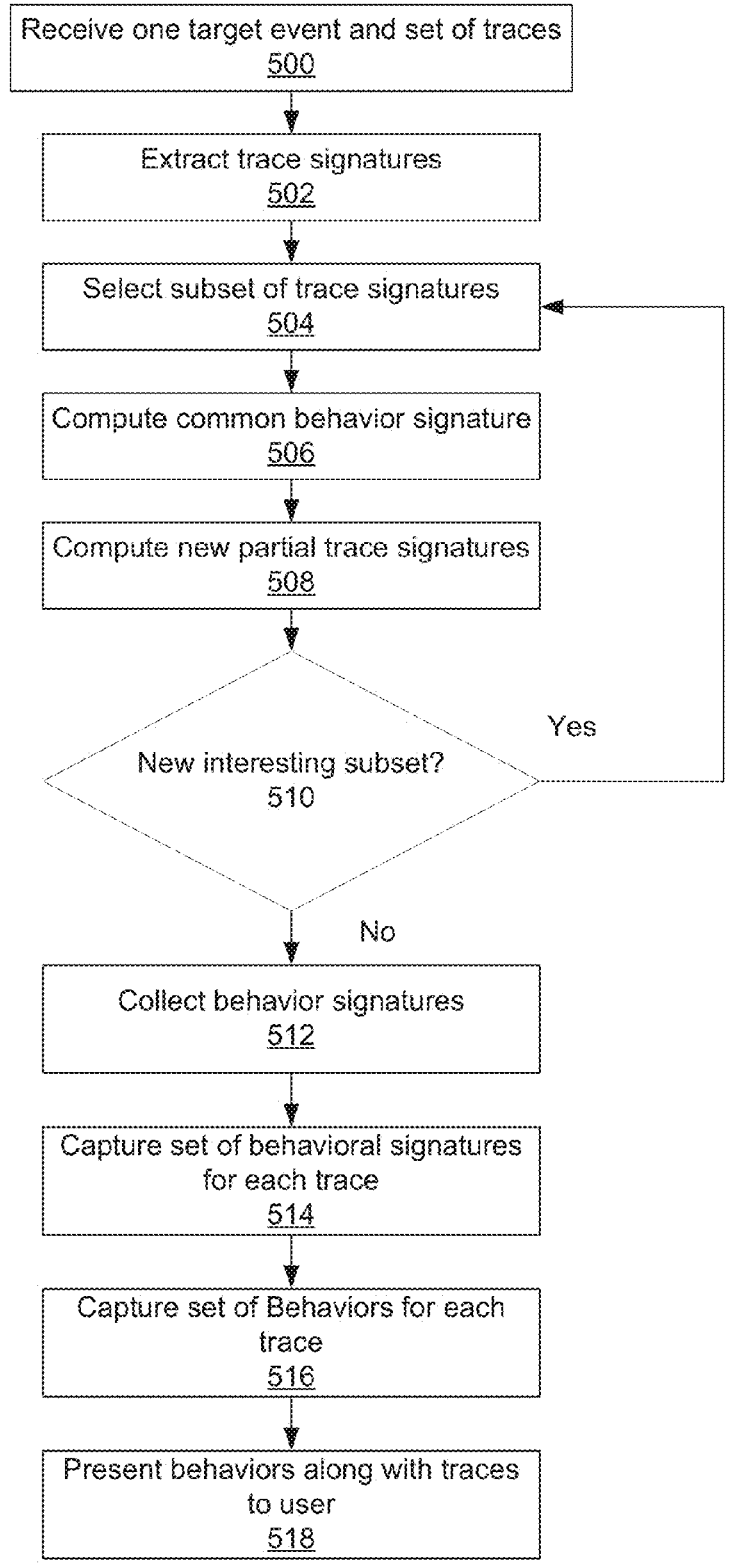
FIG. 5 illustrates a method for extracting behavior signatures from an existing trace set according to one embodiment.

FIG. 5 illustrates a method for extracting behavior signatures from an existing trace set. Block 500 receives one or more target events and a plurality of signal traces for a circuit design. These traces can be generated from RTL simulation or from other tools such as through formal analysis. The target events may be functional coverage points used as coverage measurements in simulation or used for reachability analysis in formal verification. Block 502 extracts a set of trace signatures from the set of traces. For each trace in the set, this block determines whether the target event(s) are exercised by the trace. If so, a trace signature is extracted from the trace. If the target is exercised more than once in a given trace, then more than one signature may be extracted for that trace. Block 504 selects a full set or subset of trace signatures or partial signatures to be fed to block 506. Initially, the candidates available to be fed to block 506 are the full set or subset of trace signatures obtained from block 502. When behavior signatures are available later in the process, partial trace signatures may be added to the candidate pool.

The selection of the subset to be transmitted to block 506 may be performed several ways. One method is selecting any subset that has not been previously transmitted to block 506. A more complicated selection process may be identifying the new partial trace signatures obtained in the last iteration of the loop to be described, and removing one of the partial trace signatures. The partial trace signature that is removed may be identified randomly, by last in first out, by first in first out, and various other schemes.

Block 506 takes the set of trace signatures transmitted from block 504 and uses the intersection operation to determine a common behavior signature. Block 508 receives the common behavior signature and applies the L-diff operation to determine a set of partial trace signatures for the current iteration of the loop. If 510 the newly generated partial trace signatures are deemed worth iterating on, the partial trace signature are passed to block 504 and the process is repeated. If not, block 512 collects the generated behavior signatures and stores them. Block 514 captures which trace signatures include which behavior signatures. This relationship can be identified and recorded during the operations of block 506 or later determined by performing intersection operations on the available behavior signatures and the available trace signatures.

Block 516 converts the relationships identified in block 514 to sets of behavior for each trace and captures the resulting relationships. In one embodiment, it may be directly analyzed whether each trace exhibits a specific behavior signature and block 514 may be skipped. Block 518 presents to the user of the analysis software the traces along with the behaviors included in each trace. The behavior signatures, traces, and trace signatures may also be stored in a database that indexes the information and relates the behaviors and traces with each other. All information generated during the process described in FIG. 5 may be stored in the database. After storing the data, traces are typically presented to the user for comprehension and debugging purposes. The behavior signatures related to the specific trace currently shown to the user can be represented alongside the trace to aid in recognition of the relationship between the two.

Figure 6A:
FIGS. 6A-6G illustrate a series of traces being broken down into behavior signatures according to the method described in FIG. 5 in accordance with one embodiment.
Figure 6B:
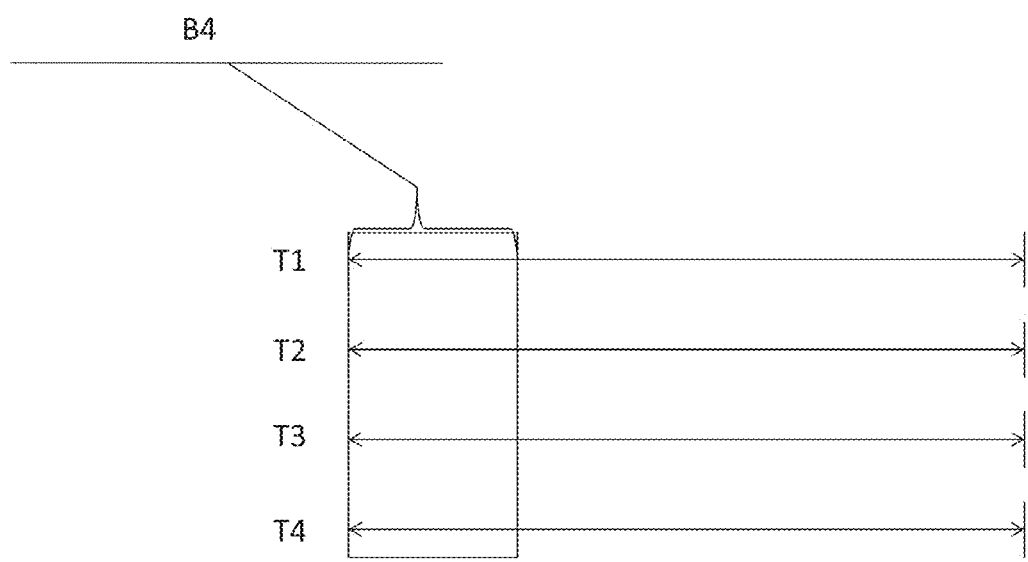
Figure 6C:
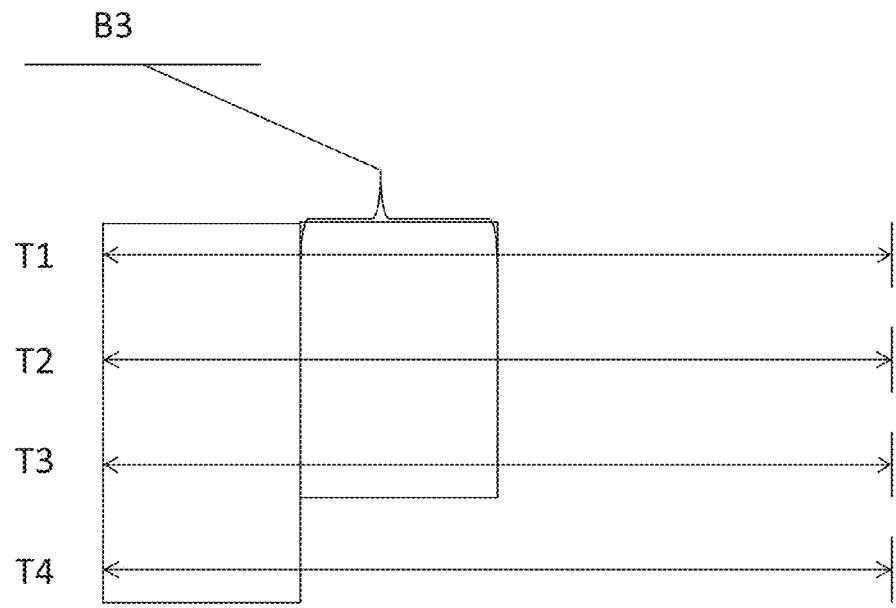

FIGS. 6A-6G illustrate a series of traces being broken down into behavior signatures according to the method described in FIG. 5. FIG. 6A illustrates a set of four trace signatures T1-T4 each containing an instance of a target event. FIG. 6B illustrates the intersection of T1, T2, T3, and T4, which is designated behavior signature B4. FIG. 6C illustrates the L-diff of the intersection of T1, T2, and T3 with B4, which is designated behavior signature B3. In this example, we omit T4 when calculating B3, but any of the traces could have been omitted. Other selection algorithms can choose to omit any of the trace signatures T1-T4.

Figure 6D:
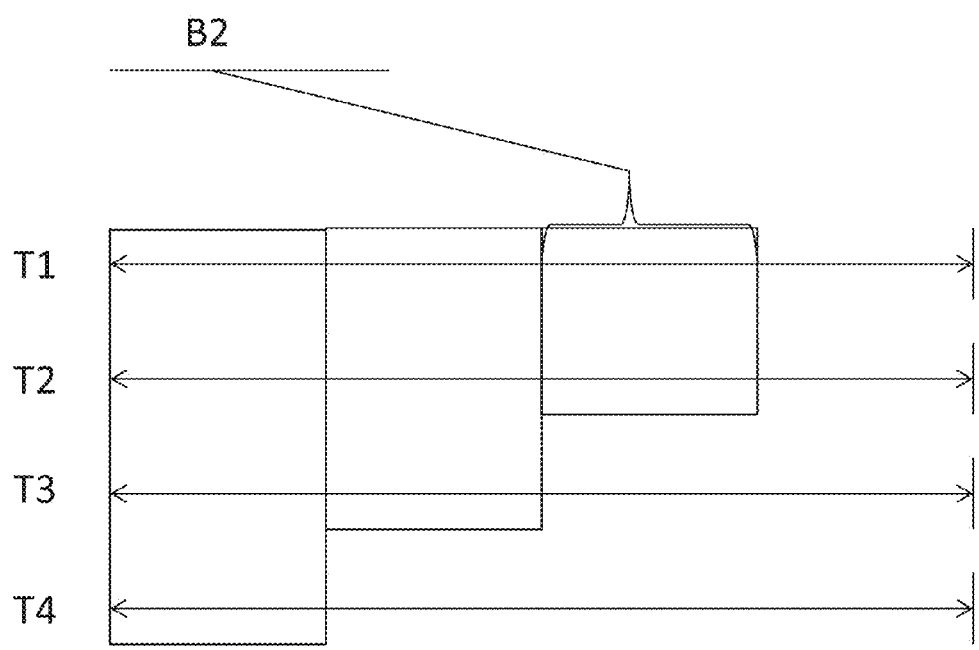
Figure 6E:
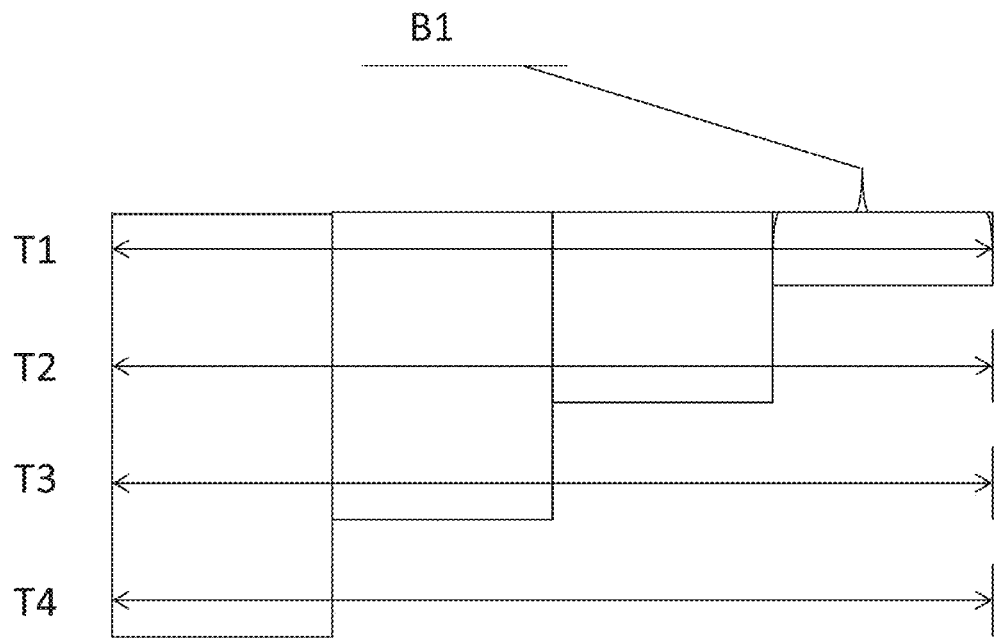
Figure 6F:
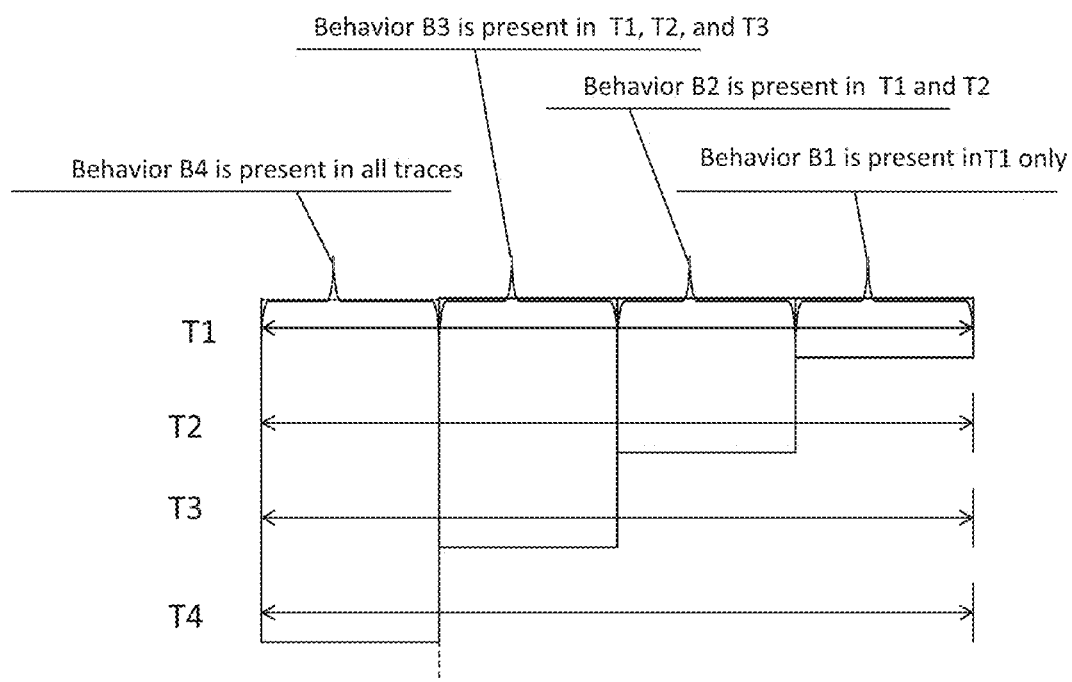
Figure 6G:
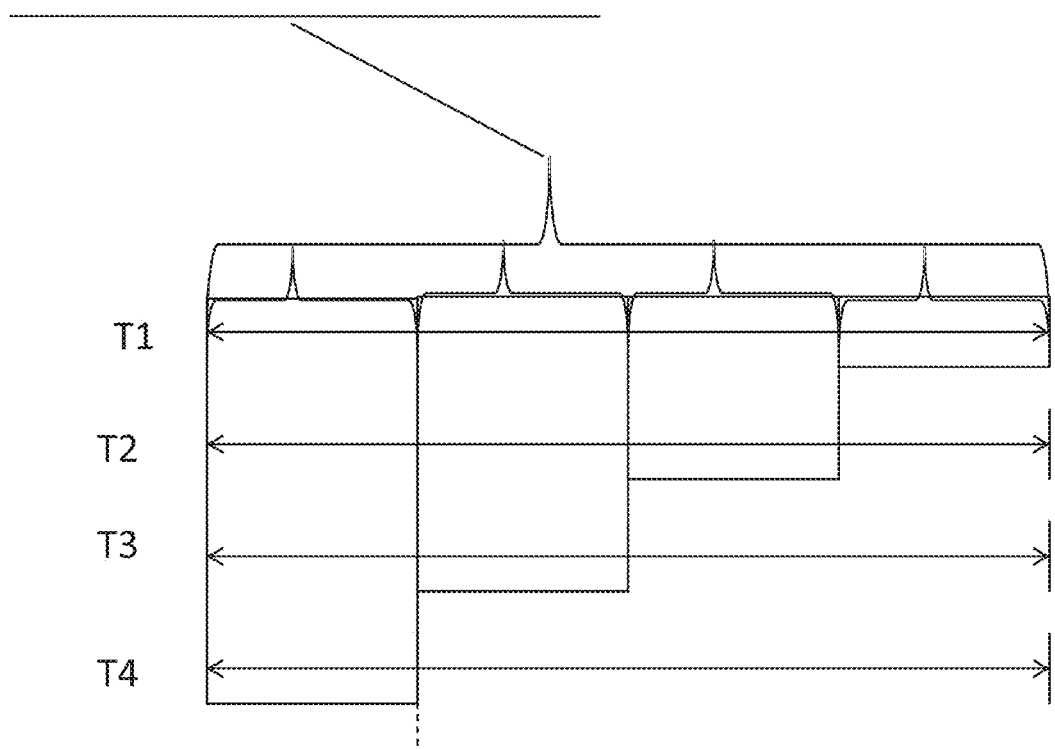

FIG. 6D shows calculating behavior signature B2 by finding the L-diff intersection of T1 and T2 with the union of B4 and B3. Finally, behavior signature B1 in FIG. 6E is calculated using the L-dif of T1 with the union of B4, B3, and B2. FIG. 6F illustrates how each of the behaviors is present in certain traces. B1 is present in T1 only, B2 is present in T1-T2, B3 is present in T1-T3, and B4 is present in T1-T4. All of the traces include one or more behavior signatures. FIG. 6G illustrates that the union of B1 through B4 is equal to T1. In other words, trace signature T1 can be decomposed into behaviors B1-B4.

Figure 7A:
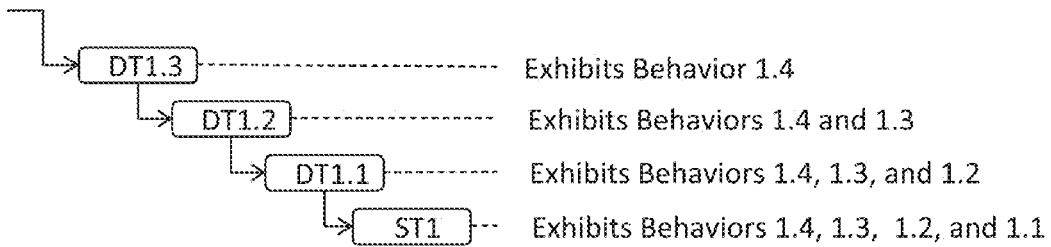
FIG. 7A illustrates a hierarchical view for visualizing the traces that are described by behaviors.
Figure 7B:
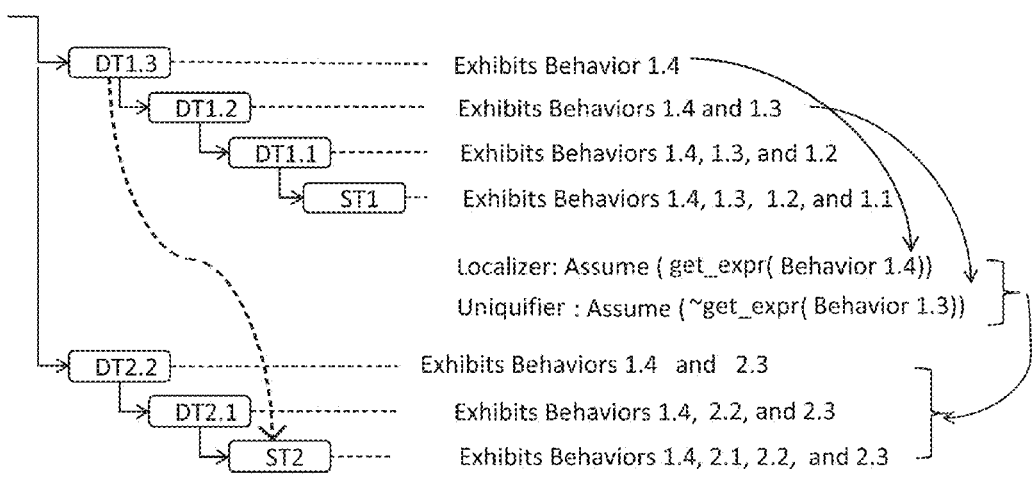
FIG. 7B illustrates a hierarchical view of traces when a second seed trace has been generated utilizing localizing and uniquifying constraints.

FIG. 7A illustrates a hierarchical view for visualizing the traces that are described by behaviors. In FIG. 7a, ST1, and DT1.1-1.3 can be described using B1.1-B.1.4. The bottom of the hierarchical tree, ST1, exhibits all of the behaviors of the traces above it in the hierarchy. As indicated, ST1 exhibits B1.1-1.4, while DT 1.3 exhibits only B1.4. FIG. 7B illustrates a hierarchical view of traces when a second seed trace has been generated utilizing localizing and uniquifying constraints. The second seed trace ST2 is generated by a trace generator. ST2 is constrained to satisfy the target events of ST1, while also constraining ST2 by the localizer (get_expr (behavior 1.4)) and uniquifier (~get_expr(behavior 1.3)). The process of constraining and generating additional traces continues to generate DT2.1 and DT2.2 based on ST2. Behaviors 2.1, 2.2, and 2.3 describe events in ST2, DT2.1 and DT2.2.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer-implemented method for trace analysis, the method comprising:
   receiving a first signal trace for a circuit design that includes signal values satisfying a target event;
   generating a first trace signature describing a portion of the first signal trace that causes the target event to occur;
   determining a first signal constraint based on the first trace signature;
   generating a second signal trace for the circuit design that includes signal values satisfying the target event, the first signal trace being different than the second signal trace, wherein the second signal trace satisfies both the target event and the first signal constraint;
   generating a second trace signature describing a portion of the second signal trace that causes the target event to occur;
   determining one or more first differential signal events that differentiate the first trace signature from the second trace signature, the first differential signal events being events from the first signal trace that cause the target event to occur; and
   indexing the one or more first differential signal events into a datastore in association with the first signal trace.

2. The method of claim 1, further comprising:
   determining one or more common signal events that are shared by the first trace signature and the second trace signature; and
   indexing the common signal events into the datastore in association with the first signal trace and the second signal trace.

3. The method of claim 1, further comprising:
   determining a second signal constraint based on the second trace signature;
   generating a third signal trace for the circuit design that satisfies both the target event and the second signal constraint, the third signal trace being different than the first signal trace and the second signal trace;
   generating a third trace signature describing a portion of the third signal trace that causes the target event to occur;
   determining one or more second differential signal events that differentiate the second trace signature from the third trace signature, the second differential signal events being events from the second signal trace that cause the target event to occur; and
   indexing the one or more second differential signal events into the datastore in association with the second signal trace.

4. The method of claim 1, further comprising debugging the circuit design using the indexed first differential signal events and first signal trace.

5. The method of claim 1, wherein the first signal constraint is determined by calculating a negated expression of the first trace signature.

6. The method of claim 3, wherein the second signal constraint is determined by calculating a negated expression of an intersection of the first trace signature and the second trace signature.

7. The method of claim 3 further comprising:
   determining a third signal constraint based on the first trace signature in parallel with determining the second signal constraint; and
   generating a fourth signal trace for the circuit design that satisfies both the target event and the third signal constraint, the fourth signal trace being different than the first, second, and third signal traces, and the fourth signal trace generated in parallel with generation of the third signal trace.

8. The method of claim 4, wherein debugging comprises displaying each of the signal traces and one or more differential signal events associated with each of the signal traces.

9. The method of claim 3, wherein the method is repeated to generate a plurality of trace signatures, each of the plurality of trace signatures accounting for one of a plurality of design constraints based on a previously generated trace signature.

10. The method of claim 7, wherein the method is repeated to generate a plurality of trace signatures, wherein each repetition comprises generating two or more of the plurality of trace signatures in parallel, each of the plurality of trace signatures accounting for one of a plurality of design constraints based on a previously generated trace signature.

11. A computer program product for trace analysis, the computer program product comprising a computer-readable storage medium containing computer program code for:
    receiving a first signal trace for a circuit design that includes signal values satisfying a target event;
    generating a first trace signature describing a portion of the first signal trace that causes the target event to occur;
    determining a first signal constraint based on the first trace signature;
    generating a second signal trace for the circuit design that includes signal values satisfying the target event, the first signal trace being different than the second signal trace, wherein the second signal trace satisfies both the target event and the first signal constraint;
    generating a second trace signature describing a portion of the second signal trace that causes the target event to occur;
    determining one or more first differential signal events that differentiate the first trace signature from the second trace signature, the first differential signal events being events from the first signal trace that cause the target event to occur; and
    indexing the one or more first differential signal events into a datastore in association with the first signal trace.

12. The computer program product of claim 11, further comprising:
    determining one or more common signal events that are shared by the first trace signature and the second trace signature; and
    indexing the common signal events into the datastore in association with the first signal trace and the second signal trace.

13. The computer program product of claim 11, further comprising:
    determining a second signal constraint based on the second trace signature;
    generating a third signal trace for the circuit design that satisfies both the target event and the second signal constraint, the third signal trace being different than the first signal trace and the second signal trace;
    generating a third trace signature describing a portion of the third signal trace that causes the target event to occur;
    determining one or more second differential signal events that differentiate the second trace signature from the third trace signature, the second differential signal events being events from the second signal trace that cause the target event to occur; and
    indexing the one or more second differential signal events into the datastore in association with the second signal trace.

14. The computer program product of claim 11, further comprising debugging the circuit design using the indexed first differential signal events and first signal trace.

15. The computer program product of claim 11, wherein the first signal constraint is determined by calculating a negated expression of the first trace signature.

16. The computer program product of claim 13, wherein the second signal constraint is determined by calculating a negated expression of an intersection of the first trace signature and the second trace signature.

17. The computer program product of claim 13, further comprising:
   determining a third signal constraint based on the first trace signature in parallel with determining the second signal constraint; and
   generating a fourth signal trace for the circuit design that satisfies both the target event and the third signal constraint, the fourth signal trace being different than the first, second, and third signal traces, the fourth signal trace generated in parallel with generation of the third signal trace.

18. The computer program product of claim 14, wherein debugging comprises displaying each of the signal traces and one or more differential signal events associated with each of the signal traces.

19. The computer program product of claim 13, wherein the computer program code is repeated to generate a plurality of trace signatures, each of the plurality of trace signatures generated accounting for one of a plurality of design constraints based on a previously generated trace signature.

20. The computer program product of claim 17, wherein the computer program code is repeated to generate a plurality of trace signatures, wherein each repetition comprises generating two or more of the plurality of trace signatures in parallel, each of the plurality of trace signatures accounting for one of a plurality of design constraints based on a previously generated trace signature.

21. A computer-implemented method for analyzing trace signatures, the method comprising:
   receiving a plurality of signal traces for a circuit design, each signal trace including respective signal values satisfying a common target event;
   generating a plurality of trace signatures for the plurality of signal traces, the trace signatures including at least a first trace signature and a second trace signature, the first trace signature generated from the respective signal values of a first signal trace of the plurality of signal traces and representing a portion of the first signal trace that causes the common target event to occur, the second trace signature generated from the respective signal values of a second signal trace of the plurality of signal traces and representing a portion of the second signal trace that causes the common target event to occur;
   determining a plurality differential signal events that differentiate the traces from each other based on the plurality of trace signatures; and
   indexing the plurality of differential signal events into a datastore in association with the plurality of traces.

22. A computer program product for trace analysis, the computer program product comprising a computer-readable storage medium containing computer program code for:
   receiving a plurality of signal traces for a circuit design, each signal trace including respective signal values satisfying a common target event;
   generating a plurality of trace signatures for the plurality of signal traces, the trace signatures including at least a first trace signature and a second trace signature, the first trace signature generated from the respective signal values of a first signal trace of the plurality of signal traces and representing a portion of the first signal trace that causes the common target event to occur, the second trace signature generated from the respective signal values of a second signal trace of the plurality of signal traces and representing a portion of the second signal trace that causes the common target event to occur;
   determining a plurality differential signal events that differentiate the traces from each other based on the plurality of trace signatures; and
   indexing the plurality of differential signal events into a datastore in association with the plurality of traces.

\* \* \* \* \*